Feb. 4, 1969 G. E. SMITH 3,426,180
COUNTER AND DIVIDER
Filed March 18, 1965 Sheet 1 of 2
FIG. 1
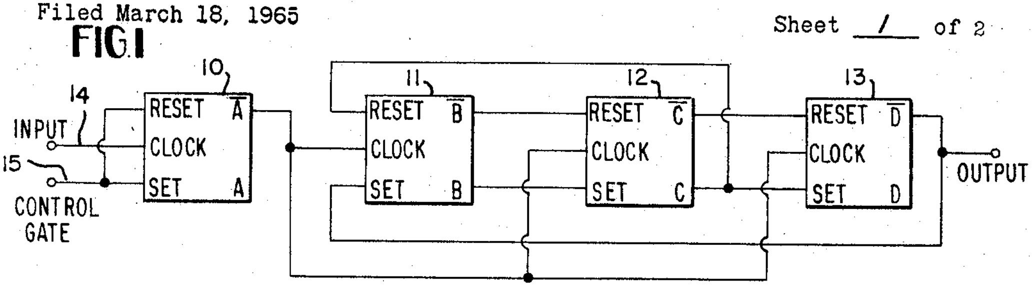
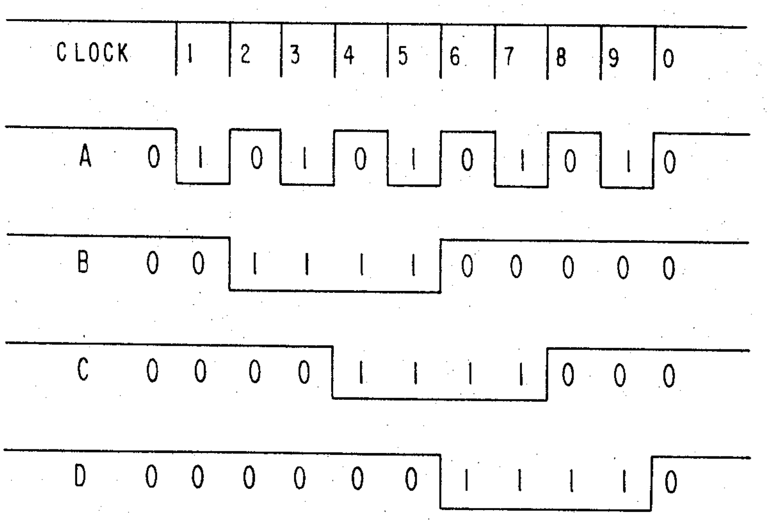
FIG. 2
FIG. 3
| | |
|---|---|
| $0 = \bar{A}\ \bar{B}\ \bar{D}$ | $1 = A\ \bar{B}\ \bar{D}$ |
| $2 = \bar{A}\ B\ \bar{C}$ | $3 = A\ B\ \bar{C}$ |
| $4 = \bar{A}\ B\ C$ | $5 = A\ B\ C$ |
| $6 = \bar{A}\ C\ D$ | $7 = A\ C\ D$ |
| $8 = \bar{A}\ \bar{C}\ D$ | $9 = A\ \bar{C}\ D$ |
*INVENTOR*
GEORGE E. SMITH
BY Sughrue, Rothwell, Mion, Zinn & Macpeak
*ATTORNEYS*

INVENTOR
GEORGE E. SMITH

BY Sughrue, Rothwell, Mion, Zinn & Macpeak
ATTORNEYS

United States Patent Office 3,426,180

Patented Feb. 4, 1969

3,426,180

COUNTER AND DIVIDER

George E. Smith, Bridgeton, Mo., assignor to Monsanto Company, St. Louis, Mo., a corporation of Delaware Filed Mar. 18, 1965, Ser. No. 440,830

U.S. Cl. 235—92 19 Claims

Int. Cl. G06f 5/02

ABSTRACT OF THE DISCLOSURE

A digital bi-quinary counter/divider comprising four flip-flops interconnected to provide an output which is easily decoded into decimal or binary coded decimal form. At least all but the first flip-flop stage is a clocked J–K flip-flop. One of the two complementary outputs of the first stage flip-flop is connected to the clock input terminals of all three of the other flip-flops.

This invention relates to a counter and divider and more particularly to a bi-quinary counter and divider.

Digital time and frequency measuring instruments, usually called counter-timers, are important laboratory instruments and components in control equipment. One particular application of the counter-timer may be in obtaining a ratio between two frequencies, $F_1$ and $F_2$, where one frequency is known and the other in unknown. In such a scheme, a counter gate is usually employed. This gate may be opened by one pulse from the $F_2$ source and closed by the next pulse from said source. While the gate is opened, pulses from the $F_1$ pass to the output of the gate and are fed to the counter. The counter will respond to the pulses applied thereto and the final count therein will represent the ratio of $F_1/F_2$.

In the event that the count of the counter is fed to a read-out network, such as a plurality of numeric display tubes, an example of which is shown in U.S. Patent No. 2,834,912, decoding must be done between counter and drivers for said tubes. In the usual case, such tubes operate in the decimal mode and therefore, the decoder must be capable of decoding from the bi-quinary mode to the decimal mode. As an illustration, the present invention finds utility in such an environment. The counter of this invention provides a unique gating feature and coupled with its unique bi-quinary mode of operation adapts extremely well to simple, accurate and inexpensive decoding networks. Such adaptation is particularly well achieved when the decoding networks feed decimal mode operated devices.

Broadly, the counter of this invention includes a plurality of flip-flop stages connected in a bi-quinary mode with the so-called "bi" stage as the first stage, in which the flip-flops are of the clocked variety, at least the first two stages of which are of the so-called J–K type, later to be more specifically identified.

The divider of this invention finds particular utility in those instances in which a time base is to be generated which is a submultiple of another time base. Such dividers find utility as frequency measuring instruments. The gating advantage associated with the counter of this invention above identified attach also to the divider of this invention. Additionally, the divider incorporates a feature which permits the generation of the submultiple time base coincident with the first pulse supplied to the divider.

It should be noted that "divider" and "counter" are merely names given to the application of the unique bi-quinary logic device of the invention. A bi-quinary device is inherently a decade counter, i.e., it registers a unique pattern of "1's" and "0's" or SET's and RESET for each digit from 0 to 9 and repeats itself beginning after every tenth input pulse. In the bi-quinary device of the present invention, as will be more fully explained hereafter, at least one of the outputs of one of the flip-flops produces an output pulse only once for every ten input pulses applied to the bi-quinary device. Consequently, if that output is used as the output of the bi-quinary device, the device acts as a divide by 10 circuit.

For the purposes of the specification and claims, a clocked flip-flop may be defined as one having two states of equilibrium, RESET and SET inputs and complementary outputs and a CLOCK input. It should be noted that in some publications the RESET input is called the CLEAR input. The term RESET will be used throughout the specification for purposes of clarity. In such instances, the complementary outputs assume signal states depending upon the condition of the RESET and SET inputs at the time when a clock pulse is fed to the CLOCK input of the flip-flop.

Examples of such flip-flops are the so-called R–S and J–K flip-flops, described in pages 115–129 of "Logical Design of Digital Computers," by M. Phister, Jr., published in 1958 by John Wiley & Sons, Inc.

As explained in the above-mentioned publication, an R–S flip-flop is one having SET and RESET inputs and complementary outputs, i.e., SET and RESET outputs. As is well known in the computer art, if the SET output is 1 the RESET output is 0, and vice versa. The logic of the R–S flip-flop is shown in the table below.

| Input | | Output SET |
|---|---|---|
| R | S | |
| 0 | 1 | 1 |
| 1 | 0 | 0 |
| 0 | 0 | (1) |
| 1 | 1 | ? |

1 No change.

It can be seen from the above table that if both SET and RESET inputs are "1's" the stable state of the flip-flop is indeterminable. Thus it is necessary to prevent both inputs from being 1.

The J–K flip-flop differs from the R–S flip-flop in only one respect. When both SET and RESET inputs are "1's" the flip-flop will change state. For example, if the J–K flip-flop is in its SET state such that the SET output is 1 and the RESET output is 0, the flip-flop will switch to its RESET state (RESET output is 1 and SET output is 0) upon the application of logical 1's to both SET and RESET inputs.

The bi-quinary logic device of the present invention uses R–S and J–K flip-flops of the clocked variety. A clocked flip-flop is one, well known in the art, which also has a CLOCK input that acts only as a trigger pulse for the SET and RESET inputs, i.e., the SET and RESET inputs have no effect on the flip-flop unless a CLOCK input is also present. One example of a clocked J–K flip-flop is shown in U.S. Patent 2,898,479.

It is therefore one object of the present invention to provide a counter and divider, each of which lends itself to random event counting or dividing as the case may be.

It is also an object of the present invention to provide a counter and divider, each of which incorporates an internal gating feature.

It is still a further object of the present invention to provide a counter and divider operating in a bi-quinary mode, the counter being adapted for use with a simple, reliable, accurate and inexpensive bi-quinary-to-decimal decoding network.

It is a further object of the present invention to provide a counter which finds particular utility when associated with an output display device, such as an alphanumeric display tube.

It is a further object of the present invention to provide a divider which provides a time base which is a submultiple of the input time base, the former being initiated coincident with the first pulse applied thereto.

It is still a further object of the present invention to provide a new and improved pulse-to-decimal converter.

Another object of the present invention is to provide a new and improved pulse-to-binary coded decimal converter.

These and other objects of the present invention will become more apparent from a detailed description of the accompanying drawings.

In the drawings:

FIGURE 1 is a block diagram of a four-stage bi-quinary counter showing input and output connections for each of the stages;

FIGURE 2 is a timing diagram associated with the counter of FIGURE 1;

FIGURE 3 is a truth table for the counter of FIGURE 1;

FIGURE 5 shows a decoding matrix for use in association with FIGURE 4 to provide decimal outputs particularly adapted for priming of multi-cathode alphanumeric display tubes as above referred to;

Figure 4:
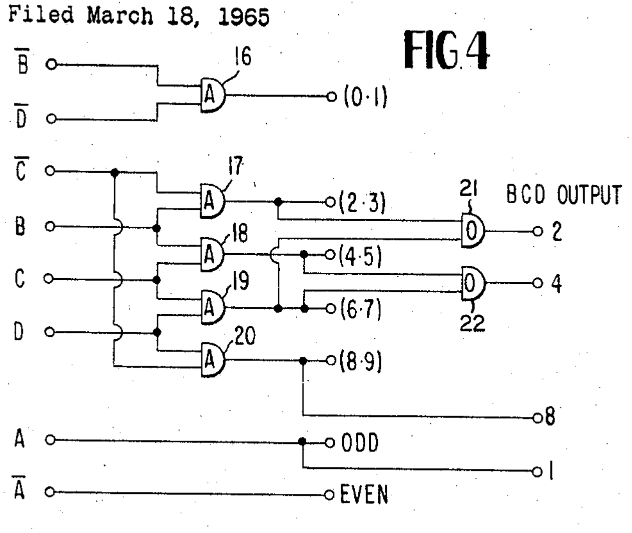
FIGURE 4 is a decoding matrix for decoding the outputs of the counter of FIGURE 1, which matrix will provide binary coded decimal output as shown and when combined with the circuit of FIGURE 5, a decimal output.

Referring to the figures illustrating the counter of the present invention, the four stages are identified by numerals 10, 11, 12 and 13. These four stages are clocked flip-flops and at least flip-flops 10 and 11 must be of the J–K type. The signal to be counted is fed to the input line 14, the CLOCK input of flip-flop 10, and the control gate signal is fed on line 15 to the SET and RESET inputs of flip-flop 10. Assuming that positive two-state logic is employed and a 1 level is indicative of an up voltage and a 0 level of a down voltage, to the control gate is applied either a 1 or a 0 signal. When a 0 is thus applied, the complementary outputs A and $\overline{A}$, otherwise referred to as the SET and RESET outputs respectively, do not change upon the application of a pulse to the clock pulse input on line 14. With a 1 level applied at the control gate to both the RESET and the SET inputs, flip-flop 10 will reverse its state to provide reversing complementary outputs at A and $\overline{A}$ for each clock pulse applied to the input. The $\overline{A}$ output of flip-flop 10 is connected to the CLOCK input of flip-flops 11, 12 and 13, the $\overline{B}$ output of flip-flop 11 is connected to the RESET input of flip-flop 12, the B output of 11 is connected to the SET input of 12, the $\overline{C}$ output of 12 is connected to the RESET input of 13, the C output of 12 is fed to the SET input of 13. Additionally, the C output of 12 is fed to the RESET input of 11, the $\overline{D}$ of 13 is fed back to the set input of 11. The $\overline{D}$ output for this particular decade may also be fed to a second decade similarly arranged to the first decade.

FIGURE 2 shows the waveforms associated with the counting of this counter and it will be noticed that, assuming a 1 level from the control gate, the A flip-flop or as shown in FIGURE 1 the number 10 flip-flop, changes state for each clock pulse fed thereto. The second stage (B), third stage (C) and the fourth stage (D) function as shown in FIGURE 2. Essentially then, as can be seen, there is at most two 1's being chased around the counter as the counting progresses. It can be seen that FIGURE 2 is a diagram of waveforms for a bi-quinary counter of the present invention which responds to low level pulses. Therefore, the low level pulses are indicated as binary 1's. However, it should be apparent to one skilled in the art that the bi-quinary counter of the present invention could be made to respond to the high level pulses and in such case the high level pulses would be designated as binary 1's and the wave shape of FIGURE 2 would be reversed with the binary indications in the same order.

Consistent with the truth table previously described in connection with the J–K type clock flip-flops, it can be seen that when the control gate is at the 0 level, the clock will not count. When the control gate provides a 1 signal, counting progresses. Each of the four stages may also have an additional input which is responsive to pulses for returning each of the flip-flops to its initial stable state.

It can be seen then that the internal gating scheme employed in the counter of this invention provides a unique way of turning the counter off and on, that is, conditioning it to respond to the input signal to be counted or deconditioning it so that it is not affected by said input signal. During the so-called off or deconditioned time, the count of the counter may be decoded and provided to the drivers for the alphanumeric display tube.

As shown in FIGURE 1, each of the flip-flops are shown as clocked flip-flops, and also as previously explained, flip-flops 10 and 11 are J–K clocked flip-flops. However, it should be apparent that if the gating scheme is not required, flip-flop 10 need not be a clocked J–K flip-flop but may be an ordinary J–K flip-flop with the input signals applied in parallel to the SET and RESET inputs. In such case the stage 10 would "toggle" or change its state in response to each 1 input pulse.

In connection with decoding, reference is made to FIGURE 3 which shows the logical outputs to provide a decimal output from 0 to 9 for each of the decades. These outputs are connected as shown in FIGURE 4 to AND gates 16 through 20 to provide the outputs as shown. For instance, AND gate 16 provides the 0 or 1, AND gate 17 the 2 or 3. OR gates 21 and 22 are connected as shown to provide the 2 and 4 outputs respectively for binary coded decimals. The output from AND gate 20 provides the 8 output and the A output of the first stage provides the 1 output for the binary coded decimal.

Figure 5:
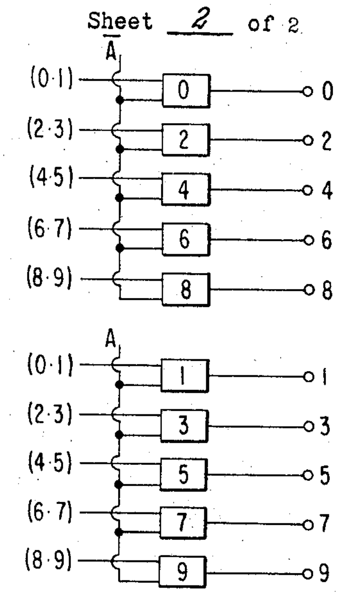

As shown in FIGURE 5, the outputs from AND gates 16–20 of FIGURE 4 are provided to AND gates 0 through 9 in conjunction with the A and the $\overline{A}$ outputs of the first stage to provide the 0 to 9 decimal outputs. These outputs are provided to the display tube driver. It can be seen that with the counter constructed in accordance with this invention and the first or A stage illustrated by flip-flop 10 being the bi-stage to which the input signal is fed, the count is consequently divided between odd and even, the odd count being associated with A and the even count with $\overline{A}$. This enables the use of a simple, efficient and effective decoding matrix coupled to the alphanumeric display tube. Also, as can be seen, it is quite easy to provide binary coded decimal outputs.

Figure 6:
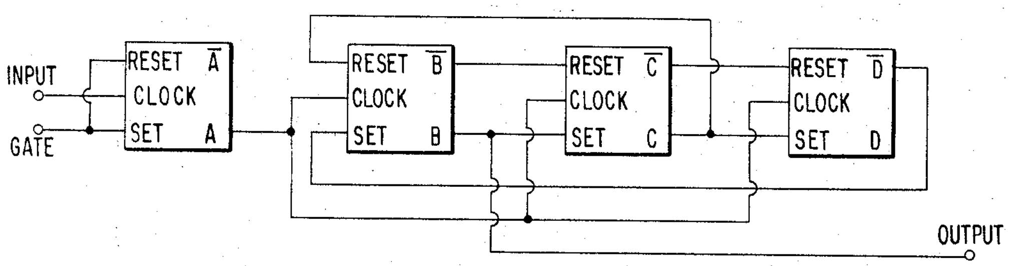
FIGURE 6 is a four-stage divider constructed in accordance with the present invention showing the input and output connections for each of said stages.
Figure 7:
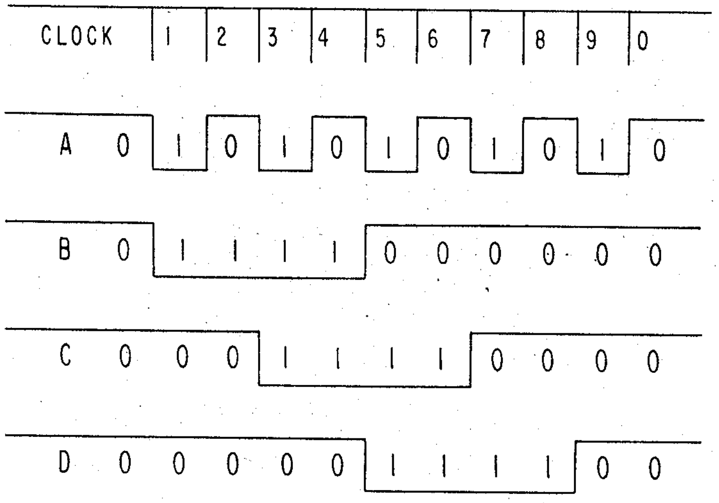
FIGURE 7 is a timing diagram associated with the divider of FIGURE 6.

The divider of the present invention, as shown in FIGURE 6, is quite similar to the counter except for the fact that the output to the next decade is taken from the B output of the second stage flip-flop. The timing diagram associated with the divider is shown in FIGURE 8. It can be seen that the time base (in this case one-tenth time base) is generated by the first clock input to the A stage of the divider. The internal gating scheme here is the same as that associated with the counter. Additionally, at least the first two stages, shown here as A and B, should be of the J–K clock flip-flop type. The time base provided at the output shown here will be one-tenth the time base of the input signal to the clock input of the A stage. Such an arrangement would provide one output for every ten input pulses to the divider and the submultiple time base would be initiated coincident with the first input pulse thereto. Therefore, all decades of the divider would give an output immediately and the count would begin substantially at once. This is in contradistinction to the arrangement in which the output from decade to decade is taken from the D stage. Of course, the output from the first decade provides the one-tenth time base and is fed to the A stage of the second decade. In the second decade, the 1/100 time base would be taken from the B stage as shown here in connection with the first decade. Similar connections are made from the B stages of all of the other decades.

What has been shown are various embodiments of the present invention. Other embodiments obvious from the teachings herein to those skilled in the art are contemplated to be within the spirit and scope of the accompanying claims.

What is claimed is:

1. A digital counter-divider comprising first, second, third and fourth bistable elements, said second, third and fourth bistable elements being of the type having SET, RESET, and CLOCK inputs and SET and RESET outputs corresponding to SET and RESET stable states, wherein at least said first and second bistable elements are J–K flip-flops, means for connecting the output of said first bistable element to the CLOCK inputs of said second, third and fourth bistable elements, and means interconnecting said bistable elements for providing a single output pulse for every ten pulses applied to the input of said first binary element, wherein said means interconnecting comprises means connecting the SET outputs from said second and third bistable elements to the SET inputs of said third and fourth bistable elements respectively, means connecting the RESET outputs from said second and third bistable elements to the RESET inputs of said third and fourth bistable elements respectively, means connecting the RESET output of said fourth bistable element to the SET input of said second bistable element, and means connecting the SET output of said third bistable element to the RESET input of said second bistable element.

2. A digital counter-divider comprising first, second, third and fourth bistable elements, said second, third and fourth bistable elements being of the type having SET, RESET, and CLOCK inputs and SET and RESET outputs corresponding to SET and RESET stable states, wherein at least said first and second bistable elements are J–K flip-flops, means for connecting the output of said first bistable element to the CLOCK inputs of said second, third and fourth bistable elements, and means interconnecting said bistable elements for providing a single output pulse for every ten pulses applied to the input of said first binary element, wherein said first bistable element is a clocked J–K flip-flop having SET, RESET and CLOCK inputs and RESET and SET outputs.

3. A digital counter-divider as claimed in claim 2 wherein said means interconnecting comprises:

(a) means connecting the SET outputs from said second and third bistable elements to the SET inputs of said third and fourth bistable elements respectively, (b) means connecting the RESET outputs from said second and third bistable elements to the RESET inputs of said third and fourth bistable elements respectively, (c) means connecting the RESET output of said fourth bistable element to the SET input of said second bistable element, (d) means connecting the SET output of said third bistable element to the RESET input of said second bistable element, and (e) means connecting one of said outputs of said first bistable element to the CLOCK inputs of said second, third and fourth bistable elements.

4. A digital counter-divider as claimed in claim 3 further comprising a source of trigger signals connected to the CLOCK input of said first bistable means, and means for providing a control gate connected to the SET and RESET inputs of said first bistable element.

5. A digital counter-divider comprising first, second, third and fourth bistable elements, said second, third and fourth bistable elements being of the type having SET, RESET, and CLOCK inputs and SET and RESET outputs corresponding to SET and RESET stable states, wherein at least said first and second bistable elements are J–K flip-flops, means for connecting the output of said first bistable element to the CLOCK inputs of said second, third and fourth bistable elements, means interconnecting said bistable elements for providing a single output pulse for every ten pulses applied to the input of said first binary element, and logic means for decoding the count in said bistable elements into a decimal indication.

6. A digital counter-divider as claimed in claim 1 further comprising logic means for decoding the count in said bistable elements into a decimal indication.

7. A digital counter-divider as claimed in claim 2 further comprising logic means for decoding the count in said bistable elements into a decimal indication.

8. A digital counter-divider as claimed in claim 3 further comprising logic means for decoding the count in said bistable elements into a decimal indication.

9. A digital counter-divider as claimed in claim 4 further comprising logic means for decoding the count in said bistable elements into a decimal indication.

10. A digital counter-divider first, second, third and fourth bistable elements, said second, third and fourth bistable elements being of the type having SET, RESET, and CLOCK inputs and SET and RESET outputs corresponding to SET and RESET stable states, wherein at least said first and second bistable elements are J–K flip-flops, means for connecting the output of said first bistable element to the CLOCK inputs of said second, third and fourth bistable elements, means interconnecting said bistable elements providing a single output pulse for every ten pulses applied to the input of said first binary element, and logic means for decoding the count in said bistable elements into a binary coded decimal.

11. A digital counter-divider as claimed in claim 1 further comprising logic means for decoding the count in said bistable elements into a binary coded decimal.

12. A digital counter-divider as claimed in claim 2 further comprising logic means for decoding the count in said bistable elements into a binary coded decimal.

13. A digital counter-divider as claimed in claim 3 further comprising logic means for decoding the count in said bistable elements into a binary coded decimal.

14. A digital counter-divider as claimed in claim 4 further comprising logic means for decoding the count in said bistable elements into a binary coded decimal.

15. A system for converting a digital signal to a decimal indication of the number of pulses in said digital signal comprising:

(a) a bi-quinary counter having first, second, third and fourth bistable stages each having SET, RESET, and CLOCK inputs, and SET and RESET outputs, and wherein at least said first and second bistable stages are clocked J-K flip-flops, (b) first logic means, having the SET and RESET outputs of said second, third and fourth bistable stages connected as inputs thereto, for providing an output on one out of five output lines, wherein each output line is indicative of a unique even numbered digit of the decimal system and an odd numbered digit which is one higher than said even numbered digit, and (c) second logic means, having connected as inputs thereto the SET and RESET outputs of said first bistable stage and said five output lines of said first logic means, for providing a unique decimal digit indication.

16. A system for converting a digital signal to a decimal indication of the number of pulses in said digital signal as claimed in claim 15 wherein said first logic means comprises:

(a) first, second, third, fourth and fifth AND gates, each having two inputs and one output,
(b) said RESET outputs from said second and fourth bistable stages being connected as the inputs of said first AND gate,
(c) said RESET output of said third bistable stage and said SET output of said second bistable stage being connected as the inputs of said second AND gate,
(d) said SET outputs of said second and third bistable stages being connected as the inputs of said third AND gate,
(e) said SET inputs of said third and fourth bistable stages being connected as the inputs of said fourth AND gate, and
(f) said SET output of said fourth bistable stage and said RESET output of said third bistable stage connected as the inputs of said fifth AND gate.

17. A system for converting a digital signal to a decimal indication of the number of pulses in said digital signal as claimed in claim 15 wherein said second logic means comprises:

(a) first and second groups of AND gates, each group including five AND gates and each AND gate having two inputs and one output,
(b) means for connecting the SET output of said first bistable stage to one input of each AND gate in said first group,
(c) means for connecting RESET output of said first bistable stage to one input of each AND gate in said second group, and
(d) means for connecting said five output lines of said first logic means to the other of said inputs of said AND gates of said first and second group, whereby each said output line is connected to one AND gate of said first group and one AND gate of said second group.

18. A system for converting a digital pulse signal to a decimal indication of the number of pulses in said signal comprising:

(a) first, second, third and fourth bistable stages, each having SET, RESET and CLOCK inputs and SET and RESET outputs, and wherein at least said first and second bistable stages are J-K clocked flip-flops,
(b) means for connecting the RESET output of said first bistable stage to the CLOCK input of said second bistable stage,
(c) means for connecting the RESET outputs of said second and third bistable stages to said RESET inputs of said third and fourth bistable stages respectively,
(d) means for connecting the SET outputs of said second and third bistable stages to said SET inputs of said third and fourth bistable stages respectively,
(e) means for connecting the RESET output of said fourth bistage stage to the SET input of said second bistable stage,
(f) means for connecting the SET output of said third bistable stage to the RESET input of said second bistable stage,
(g) first, second, third, fourth and fifth AND gates each having two inputs and one output,
(h) means for connecting the RESET outputs of said second and fourth bistable stages to the inputs of said first AND gate,
(i) means for connecting the RESET output of said third bistable stage and the SET output of said second bistable stage to the inputs of said second AND gate,
(j) means for connecting the SET outputs of said second and third bistable stages to the inputs of said third AND gate,
(k) means for connecting the SET outputs of said third and fourth bistable stages to be the inputs of said fourth AND gate,
(l) means for connecting SET output of said fourth bistable stage and the RESET output of said third bistable stage to the inputs of said fifth AND gate,
(m) sixth, seventh, eighth, ninth and tenth AND gates, each having two inputs and an output,
(n) means for connecting the outputs from said first, second third, fourth and fifth AND gates to one input of each of said sixth, seventh, eighth, ninth and tenth AND gates respectively,
(o) means of connecting the RESET output of said first bistable stage to each of the other inputs of said sixth, seventh, eighth, ninth and tenth AND gates,
(p) eleventh, twelfth, thirteenth, fourteenth and fifteenth AND gates, each having two inputs and an output,
(q) means for connecting the outputs from said first, second, third, fourth and fifth AND gates to one input of each of said eleventh, twelfth, thirteenth, fourteenth and fifteenth AND gates respectively, and
(r) means for connecting the SET output of said first bistable stage to each of the other inputs of said eleventh, twelfth, thirteenth, fourteenth and fifteenth AND gates.

19. A system for converting a digital pulse signal to a binary coded decimal indication of the number of pulses in said signal comprising:

(a) first, second, third and fourth bistable stages, each having SET, RESET and CLOCK inputs and SET and RESET outputs, and wherein at least said first and second bistable stages are J–K clocked flip-flops,
(b) means for connecting the RESET output of said first bistable stage to the CLOCK input of said second bistable stage,
(c) means for connecting the RESET outputs of said second and third bistable stages to said RESET inputs of said third and fourth bistable stages respectively,
(d) means for connecting the SET outputs of said second and third bistable stages to said SET inputs of said third and fourth bistable stages respectively,
(e) means for connecting the RESET output of said fourth bistable stage to the SET input of said second bistable stage,
(f) means for connecting the SET output of said third bistable stage to the RESET input of said second bistable stage,
(g) first, second, third and fourth AND gates, each having two inputs and one output,
(h) first, second, third, and fourth output means for indicating the decimal digits 1, 2, 4 and 8 respectively,
(i) first and second OR gates, each having two inputs and one output,
(j) means for connecting the RESET output of said third bistable stage and the SET input of said second bistable stage to the two inputs respectively of said first AND gate,
(k) means for connecting the SET outputs of said second and third bistable stages to the two inputs respectively of said second AND gate,
(l) means for connecting the SET outputs of said third and fourth bistable stages to the two inputs respectively of said third AND gate,
(m) means for connecting the SET output of said fourth bistable stage and the RESET output of said third bistable stage to the two inputs respectively of said fourth AND gate, (n) means for connecting the outputs of said first and third AND gates to the two inputs respectively of said first OR gate, (o) means for connecting the outputs of said second and third AND gates to the two inputs respectively of said second OR gate, and (p) means for connecting the SET output of said first bistable stage and the outputs of said first OR gate, said second OR gate, and said fourth AND gate to said first, second, third and fourth output indicating means respectively.

References Cited

UNITED STATES PATENTS

| | | | |
|---|---|---|---|
| 2,814,441 | 11/1957 | Chaimowcz | 235—92 |
| 2,935,255 | 5/1960 | Reiner | 235—92 |
| 3,274,582 | 9/1966 | Gibson | 340—347 |
| 3,350,708 | 10/1967 | Adler | 235—92 |

MAYNARD R. WILBUR, *Primary Examiner.*

GREGORY J. MAIER, *Assistant Examiner.*

U.S. Cl. X.R.

340—347; 235—155; 328—39.